United States Patent
Makowiecki et al.

[11] Patent Number: 5,381,944
[45] Date of Patent: Jan. 17, 1995

[54] LOW TEMPERATURE REACTIVE BONDING

[75] Inventors: Daniel M. Makowiecki; Richard M. Bionta, both of Livermore, Calif.

[73] Assignee: The Regents of the University of California, Oakland, Calif.

[21] Appl. No.: 145,568

[22] Filed: Nov. 4, 1993

[51] Int. Cl.$^6$ ............................................. B23K 31/02
[52] U.S. Cl. ..................... 228/124.5; 228/190; 228/234.3; 428/941
[58] Field of Search ................. 228/124.5, 190, 124.1, 228/198, 234.3; 428/941

[56] References Cited

U.S. PATENT DOCUMENTS 2,402,834  6/1946  Nachtman ........................... 428/941
3,396,454  8/1968  Murdock et al. .................... 228/190
3,415,697  12/1968  Bredzs et al. ...................... 228/234.3

FOREIGN PATENT DOCUMENTS 60-251177 12/1985 Japan ................................. 228/234.3

Primary Examiner—Kurt Rowan
Assistant Examiner—Jeffrey T. Knapp
Attorney, Agent, or Firm—Henry P. Sartorio

[57] ABSTRACT

The joining technique requires no external heat source and generates very little heat during joining. It involves the reaction of thin multilayered films deposited on faying surfaces to create a stable compound that functions as an intermediate or braze material in order to create a high strength bond. While high temperatures are reached in the reaction of the multilayer film, very little heat is generated because the films are very thin. It is essentially a room temperature joining process.

22 Claims, 2 Drawing Sheets

LOW TEMPERATURE REACTIVE BONDING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the joining of materials, particularly to an ambient temperature joining technique, and more particular to a process for joining materials which requires no external heat source, which generates very little heat, and which can be carried out at room temperature.

The basis types of material joining techniques include adhesives, solders, brazes, and fusion welds. Organic adhesives produce low strength bonds compared to the high strength metallic bonds. However, only adhesive bonds can be made at ambient temperatures. Except for very usual techniques such as high pressure solid-state joining there are no high strength, low temperature joining techniques. There are many potential applications for a low temperature, high strength joining process such as for electronic materials, component and integrated circuits (IC's), and materials with metastable structures (i.e., intermetallic compounds, amorphous metal alloys).

The present invention satisfies this need in the art by providing a joining technique that requires no external heat source and generates very little heat in the joining process. It involves the reaction of thin multilayered films deposited on faying surfaces to create a stable compound that functions as an intermediate or braze material in order to create a high strength bond. The invention is essentially a low temperature, high strength joining process.

SUMMARY OF THE INVENTION

It is an object of the present invention to provide a materials joining process.

A further object of the invention is to provide a low temperature, high strength joining process.

A further object of the invention is to provide a joining process which involves the formation of a liquid phase of a low melting metal or alloy with heat released in an exothermic reaction of a multilayer film.

Another object of the invention is to provide a materials joining process which involves the reaction of thin multilayered films deposited on faying surfaces to create a stable compound that functions as an intermediate or braze material in order to create a high strength bond.

Another object of this invention is to produce low temperature, high strength bonds using multilayered films composed, for example, of Ti/B and Ti/Al.

Other objects and advantages of the present invention will become apparent from the following description and accompanying drawings, which set forth the principles of the invention. Basically, the invention is a low temperature reactive bonding process using multilayered films of selected materials which function as a heat source and a braze material to create a high strength bond. While high temperatures are reached in the reaction of the multilayer film, very little heat is generated because the films are very thin. The invention is essentially a room temperature joining process. When two faying surfaces are coated with a reactive multilayer film, a fusible metal, and brought into intimate contact the reaction of the intermediate multilayered films or coatings produce a stable compound and sufficient heat to melt the fusible metal and join the mated surfaces. The reaction of the multilayer produces a stable compound dispersed in the solidified metal that remains bonded to each faying surface creating a high strength bond at low temperature. For example, the process can be used for joining silicon wafers with a Ti/B multilayer and Al when reacted in vacuum, or a Ti/Al multilayer film on a TiAl compound can be reacted in vacuum to form a TiAl bond at the interfaces.

BRIEF DESCRIPTION OF THE DRAWINGS

The accompanying drawings, which are incorporated into and form a part of the disclosure, illustrate examples of the process of the invention and, together with the description, serve to explain the principles of the invention.

DETAILED DESCRIPTION OF THE INVENTION

Figure 1:
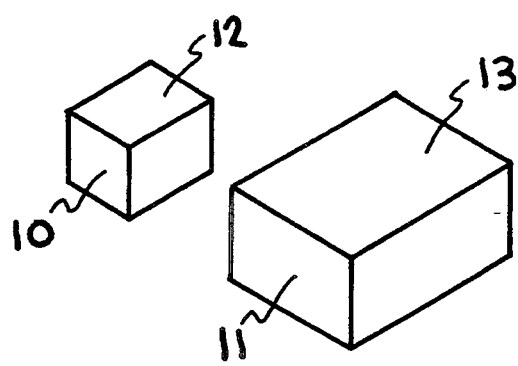
FIGS. 1-3 illustrate components and apparatus used in carrying out an example of the low temperature reactive bonding process of the present invention.

The present invention is directed to a low temperature reactive bonding process. This process provides a significant advance over conventional joining or bonding processes which provide either high strength bonds at high temperatures, or low strength bonds at low temperature joining processes (i.e. organic adhesives). This invention can produce high strength bonds in a low temperature joining process. A very significant use of the present invention is the high strength bonding of silicon wafers and integrated circuits (IC's) at low temperatures. The process of this invention can also be used, for example, to bond ceramic materials, metals and inter-metallic compounds. This invention requires no external heat source and generates very little heat in the joining process. Consequently, there is only a moderate increase in the temperature of the surfaces joined in the process. This enables the joining of temperature sensitive and thermally incompatible materials with a high strength bond.

The process or technique of the present invention involves the reaction of thin multilayered films or coatings deposited on faying (closely fit or joining) surfaces to create a stable compound and sufficient heat to melt a fusible material that functions as an intermediate or braze material in order to create a high strength bond. High temperatures are reached in the reaction of the material of the multilayer film, but very little heat is generated because the films are very thin (1-10 $\mu$m for example). The process is essentially a room temperature joining technique that produces high strength bonds similar to a high temperature brazing process. The process involves depositing, such as by magnetron sputtering, a reactive multilayer structure consisting of alternate layers of selected materials such as titanium (Ti) and boron (B) to produce a Ti/B multilayer, intermediate layers of a fusible material such as aluminum (Al) for example, and upon reaction of the reactive Ti/B layers the aluminum layers are bonded via the Ti/B multilayers. If two laying surfaces are coated with the same reactive multilayer and a fusible metal and brought into intimate contact the reaction of the intermediate multilayered coatings produce a stable compound with the generation of sufficient heat to melt the fusible metal and join the mated surfaces. If the metal compound composite material produced in the reaction remains bonded to each faying surface a high strength bond at low temperature is the end result. An example is the room temperature joining of a silicon wafers with a Ti/B multilayer and aluminum (Al) reacted in vacuum. Another example is the low temperature joining of intermetallic materials such as TiAl that are of interest in aircraft applications. A multilayer film of Ti/Al on a TiAl compound can be reacted to form a TiAl bond at the interfaces.

The present invention involves the joining of materials by the reaction of multilayered thin films, and involves the formation of a liquid phase of a low melting metal or alloy (i.e. aluminum) with the heat released in the exothermic reaction of the multilayer film. An example is the joining of silicon wafers with an aluminum coated titanium/boron (Ti/B) multilayer. The exothermic reaction of the Ti/B multilayer generates sufficient heat to melt the aluminum and raise the $TiB_2$—Al braze material to the desired temperature. This reactive multilayer braze alloy can be fabricated in sheet form and conveniently positioned at the bond interface. Almost all applications of this invention would involve the use of the exothermic reaction heat to melt a fusible metal thereby producing a transient liquid phase in the bond region with the compound formed in the multilayer reaction dispersed in the liquid. On solidification the liquid phase would form the bond between the surfaces to be jointed. Also, the liquid phase would be a composite material on solidification containing the compound produced in the multilayer reaction. This provides for the joining of temperature sensitive and thermally incompatible materials.

Figure 2:
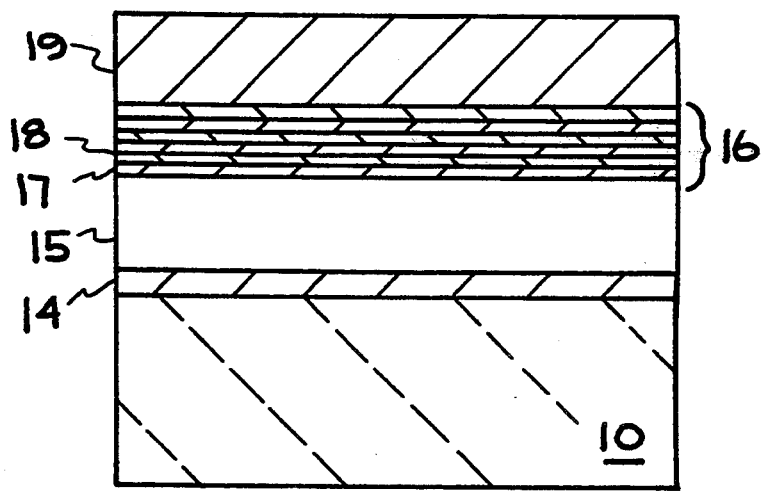
Figure 3:
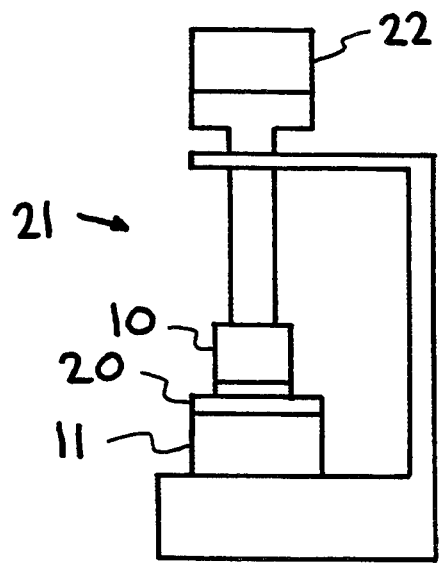
Figure 4:
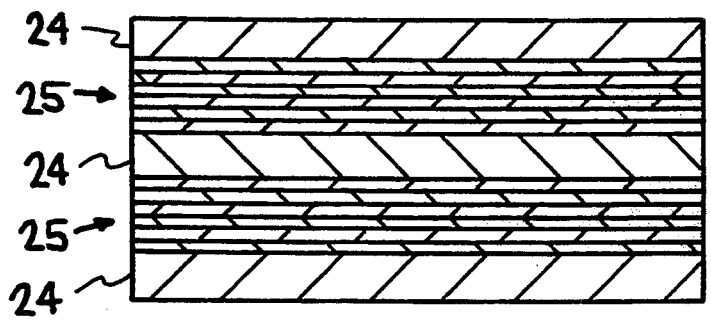
FIG. 4 illustrates an embodiment of a thicker multilayer joint, using a plurality of the various layers of selected materials.
Figure 5:
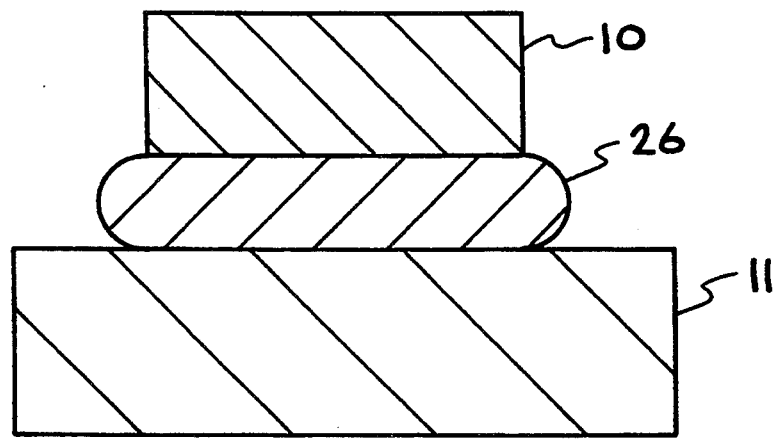
FIG. 5 illustrates the structure of the bond joint after initiating the reaction of the multilayers illustrated in FIG. 4.

Experimental verification of the low temperature reactive bonding process was carried out using a Ti/B reactive multilayer system or bonding together with silicon substrates, but is not limited to the hereinafter described example. This experimental example, is set forth as follows:

1. Selected two silicon (Si) substrates, as shown in FIG. 1, with one, indicated at 10, being about 5×5 mm, and the second, indicated at 11 being about 10×10 mm, and both having a flat polished surface, indicated at 12 and 13, respectively, of a smoothness of about 1 μm.
2. Deposit on each of the surfaces 12 and 13 of substrates 10 and 11, a 500 Å thick titanium (Ti) adhesion layer, indicated at 14 (see FIG. 2) by a vacuum coating process such as evaporation or sputtering, preferably sputtering. Such coating processes are well known in the art. The adhesion layer may also be composed of chromium and zirconium.
3. Deposit on each of the adhesion layers 14, a 1.75 μm aluminum layer, indicated at 15 (see FIG. 2), by a vacuum coating process, as in step 2 above.
4. A Ti/B multilayer (0.5–50 μm) generally indicated at 16 in FIG. 2, and composed of a plurality of alternating thin films of Ti and B, as indicated at 17 and 18, is deposited on each aluminum layer 15. These alternately films 17 and 18 are deposited by the above described vacuum coating process.
5. A second 1.75 μm aluminum layer 19 is deposited on each of the Ti/B multilayers 16, as seen in FIG. 2, by the vacuum coating process described above.
6. The coated surfaces, generally indicated at 20, with aluminum layer 19 being on the outer end thereof, of substrates 10 and 11 are mounted face-to-face in a standard gluing or bonding fixture or apparatus, indicated at 21, as seen in FIG. 3.
7. A weight 22 is positioned on the apparatus 21 which forces the reactive coatings 20 into intimate contact, see FIG. 3.
8. A reaction of the multilayers 16 may be initiated by a spark from a Tesla coil, not shown but well known in the art, producing heat thereby creating a braze material consisting of molten aluminum and the compound product of the multilayer reaction, and a high strength bond, as shown at 26 in FIG. 5. The reaction temperature is sufficient to melt the thin aluminum layers but does not substantially increase the overall temperature of the surface joined because of the thinness of the films 17 and 18.
9. The thus bonded silicon substrates 10 and 11 (see FIG. 5) are then removed from apparatus 21 for use, or where desired may be examined for melting and bonding. This examination may be carried out by cutting the thus bonded substrates to expose a cross-section thereof.

Where a thicker joint is required, a stack of alternating aluminum layers and Ti/B multilayers may be used as indicated at 24 and 25 in FIG. 4. As in FIG. 2, the multilayers 25 are each composed of alternating thin films of Ti and B. The joining process results in an end product such as illustrated in FIG. 5.

The following Table shows the atomic number (Z), weight (g/mole), density (g/cm³), and volume of 1 mole (cm³/mole) of Ti, B and $TiB_2$:

| Material | Ti | B | TiB$_2$ |
| --- | --- | --- | --- |
| Z | 22 | 5 | — |
| A (g/mole) | 47.88 | 10.81 | 69.5 |
| p (g/cm3) | 4.54 | 2.37 | 4.5 |
| Vol of 1 mole (cm3/mole) | 10.55 | 4.56 | 15.44 |

The energetics of the Ti/B multilayers and the Al/TiB composite are set forth hereinafter:

One mole of Ti combines with 2 moles of B to give one mole of $TiB_2$. The heat of reaction is between 71 and 85 KCal/mole (=1100±100 Cal/gm). The volumes needed for 1 mole are 10.55 cm³ of Ti and 2×4.56 cm³=9.12 cm³ of B to give 15.44 cm³ of $TiB_2$. Thus the total volume goes from 19.67 cm³ to 15.44 cm³. The initial unreacted mixture would be 53.6% Ti and 46.4% B by volume.

A 1 μm thick×1 cm×1 cm Ti/B multilayer built with this ratio has a total of 0.53 μm of Ti and 0.464 μm of B. The weight of the Ti is $2.4 \times 10^{-4}$ gm and of the B is $1.1 \times 10^{-4}$ gm for a total weight of $3.5 \times 10^{-4}$ gm. At 1.1±0.1 KCal/gm this deposit will release 0.386±0.035 Cal of heat.

This heat will raise the temperature of the Al and the $TiB_2$. The heat capacity of solid Al is 4.94 C/mole+$2.96 \times 10^{-3}$ T and of $TiB_2$ is 0.45 C/gm. The heat capacity of the 1 cm×1 m×1 μm Ti/B multilayer is $1.575 \times 10^{-4}$ Cal/deg. The heat capacity of solid Al averages 6.757 Cal/mole=0.25 Cal/gm (at 26.98 gm/mole). The 1 cm×1 cm×3.5 μm Al layer weighs $9.44 \times 10^{-4}$ gms (density 2.698 gm/cm$^3$) so its heat capacity is $2.36 \times 10^{-4}$ Cal/deg. The heat capacity of the total system is $3.936 \times 10^{-4}$ Cal/deg. To go from room temperature (298° K.) to the melting temperature of Al (931.7° K.) will use up $3.936 \times 10^{-4}$ Cal/-deg×633.7°=0.249 Cal.

The heat of transition for Al is 2.57 KCal/mole=95.2 Cal/gm which is 0.090 Cal for our 1 cm×1 cm×4 μm Al layer. Thus the total energy to raise the temperature of the Al and the TiB$_2$ and melt the Al is 0.339 Cal. This is to be compared with the 0.386±0.035 Cal from the reactive multilayer, thus melting the Al with the energy released.

The extra energy 0.047±0.035 Cal will raise temperature further. Above melting the heat capacity of Al is 7 C/mole=0.259 C/gm or $2.449 \times 10^{-4}$ C/o for the 1 cm×1 cm×3.5 μm Al. Including the TiB$_2$ the total heat capacity is $4.024 \times 10^{-4}$ C/o. The expected temperature rise above the melting point of Al is approximately 100° C. Note that the melted Al fills the cracks in the TiB$_2$ thereby accommodating the 21.5% volume reduction in the aluminum.

While the above description is primarily directed to the multilayer(s) being formed from alternating films of titanium and boron (Ti/B) and the fusible or braze material has been described as aluminum, the alternating films may also be composed of two groups of materials, with the first group including titanium, zirconium, hafnium, niobium, and tantalum and the second group including boron, carbon, and silicon. Also, the fusible or braze material may be selected from aluminum, tin, copper, silver, germanium, and silicon. The materials to be joined, described above as being silicon, may also be metals, metalloids, intermetallic compounds, or ceramics with a fusible or braze material coated thereon.

It has thus been shown that the present invention provides a joining process that requires no external heat source and generates very little heat in the joining process, but produces high strength bonds. Thus, the invention provides for low temperature, high strength reactive bonding.

While particular examples, procedures, materials, parameters, etc. have been illustrated and/or described, such is not intended to limit the invention. Modifications and changes will become apparent to those skilled in the art, and it is intended that the invention be limited only by the scope of the appended claims.

We claim:

1. A low temperature reactive bonding process, comprising:
   forming a multilayer of thin alternating films of reactive materials;
   forming at least one layer of fusible material;
   positioning the thus formed multilayer and fusible material between members to be joined; and
   causing a reaction of the multilayer and consequent melting of the fusible material, thereby producing a bond between the members to be joined.

2. The process of claim 1, wherein the fusible material is selected from the group consisting of aluminum, tin, copper, silver, germanium and silicon.

3. The process of claim 1, wherein the members to be joined are selected from the group consisting of metals, metalloids, intermetallic compounds, and ceramics coated with a fusible material.

4. The process of claim 1, wherein the multilayer has a thickness in the range of 0.5 to 50 μm.

5. The process of claim 1, wherein the multilayer of reactive material is fabricated in sheet of form.

6. The process of claim 1, wherein the alternating layers of the multilayer are formed of thin films of reactive materials selected alternately from a first group consisting of titanium, zirconium, halfnium, niobium, and tantalum, and from a second group consisting of boron, carbon, and silicon.

7. The process of claim 6, wherein said alternating layers of reactive material are titanium and boron, and wherein said fusible material is aluminum.

8. The process of claim 1, wherein the multilayer is formed from alternating films of titanium and boron, the fusible material is aluminum, and wherein the members to be joined are composed of silicon.

9. The process of claim 8, wherein the reaction is an exothermic reaction of a titanium/boron multilayer which generates sufficient heat to melt the aluminum and produce a titanium boron-aluminum braze material.

10. A process of joining members which requires no external heat source, comprising:
    forming thin multilayered films of reactive material on faying surfaces of members to be joined;
    providing at least a layer of a first material to be melted; and
    reacting the multilayered films to melt the first material and create a stable compound which functions as a braze material for creating a high strength bond between the members to be joined.

11. The process of claim 10, wherein the alternating films of reactive material are formed on adjacent surfaces of the members to be joined, and wherein the braze material is formed on each adjacent surface of the films of reactive material.

12. The process of claim 10, wherein the members to be joined are composed of a material selected from the group consisting of metals, metalloids, intermetallics, and ceramics or compounds coated with a material to be melted.

13. The process of claim 10, wherein the first material to be melted is selected from the group consisting of aluminum, tin, copper, silver, germanium and silicon.

14. The process of claim 10, wherein the multilayered films each have a thickness of about 0.5–50 μm 15. The process of claim 10, wherein the thin multilayered films are formed from alternating films of reactive material selected from one group consisting of titanium, zirconium, halfnium, niobium, and tantalum, and from another group consisting of boron, carbon and silicon.

16. The process of claim 15, wherein the alternating films are composed of titanium and boron.

17. The process of claim 15, wherein the alternating thin films are composed of titanium and either carbon or silicon aluminum.

18. A method for joining two silicon members, comprising:
    depositing at least one layer of metallic material on a surface of each silicon member;
    depositing a plurality of alternating layers of different reactive materials onto each of the layers of metallic material, thereby forming multilayers of reactive materials;
    depositing at least a second layer of metallic material on each of the multilayers of reactive materials;

placing the silicon members together, such that the second layers of metallic material are in a face-to-face relation; and causing a reaction of the multilayers of reactive materials to melt the layers of metallic materials to produce a braze material whereby the layers of metallic material are bonded together and to the silicon members.

19. The method of claim 18, additionally including forming a thin adhesion layer selected from the group consisting of titanium, chromium, and zirconium on each of the surfaces of the silicon members prior to depositing the layer of metallic material on each silicon member.

20. The method of claim 18, wherein the multilayers of reactive material are composed of alternating films selected alternately from a first group consisting of titanium, zirconium, halfnium, niobium, and tantalum and alternately from a second group consisting of boron, carbon, and silicon.

21. The method of claim 20, wherein the layers of metallic material are composed of materials selected from the group of aluminum, tin, copper, silver, germanium and silicon.

22. The method of claim 21, wherein the multilayers of reactive materials are formed from alternating films of titanium and boron, and wherein said layers of metallic material are formed from aluminum.

* * * * *